(12) United States Patent
Hirotsuru et al.

(10) Patent No.: US 7,993,728 B2
(45) Date of Patent: Aug. 9, 2011

(54) ALUMINUM/SILICON CARBIDE COMPOSITE AND RADIATING PART COMPRISING THE SAME

(75) Inventors: Hideki Hirotsuru, Omuta (JP); Goh Iwamoto, Omuta (JP); Hideo Tsukamoto, Omuta (JP); Satoshi Higuma, Omuta (JP); Nobuyuki Hashimoto, Omuta (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/298,598

(22) PCT Filed: Apr. 23, 2007

(86) PCT No.: PCT/JP2007/058770
§ 371 (c)(1),
(2), (4) Date: Oct. 27, 2008

(87) PCT Pub. No.: WO2007/125878
PCT Pub. Date: Nov. 8, 2007

(65) Prior Publication Data
US 2009/0092793 A1 Apr. 9, 2009

(30) Foreign Application Priority Data
Apr. 26, 2006 (JP) .................. 2006-122350

(51) Int. Cl.
*B32B 3/26* (2006.01)
(52) U.S. Cl. ........ 428/158; 428/220; 428/446; 428/613; 428/319.1; 164/98; 148/522; 451/38; 420/117
(58) Field of Classification Search .................. 428/158, 428/220
See application file for complete search history.

(56) References Cited

U.S. PATENT DOCUMENTS
5,774,336 A 6/1998 Larson
(Continued)

FOREIGN PATENT DOCUMENTS
EP 1 237 397 9/2002
(Continued)

OTHER PUBLICATIONS
U.S. Appl. No. 12/095,005, filed May 27, 2008, Hirotsuru, et al.
(Continued)

*Primary Examiner* — David R Sample
*Assistant Examiner* — Tahseen Khan
(74) *Attorney, Agent, or Firm* — Oblon, Spivak, McClelland, Maier & Neustadt, L.L.P.

(57) ABSTRACT

A base plate for power module, comprising an aluminum-silicon carbide composite and aluminum layers made of a metal containing aluminum as the main component formed on respective principal planes of the aluminum-silicon carbide composite, wherein the aluminum-silicon carbide composite is produced by forming or fabricating a flat plate-shaped silicon carbide porous body to have a thickness difference of at most 100 μm in the entire porous body and piling such porous bodies as they are each sandwiched between mold-releasing plates so that the fastening torque in the plane direction becomes from 1 to 20 Nm, and infiltrating a metal containing aluminum as the main component into the silicon carbide porous bodies,
wherein the aluminum layers each has an average thickness of from 10 to 150 μm, the difference between the maximum thickness and the minimum thickness of the aluminum layer in each principal plane is at most 80 μm, and the difference between average thicknesses of the aluminum layers on the respective principal planes is at most 50 μm, and wherein the shape of the silicon carbide porous body is rectangle or a rectangle from which peripheral portions encompassing holes are removed.

13 Claims, 3 Drawing Sheets

U.S. PATENT DOCUMENTS

| | | | |
|---|---|---|---|
| 6,388,273 B1 | 5/2002 | Yamagata et al. | |
| 6,447,894 B1 * | 9/2002 | Hirotsuru et al. | 428/307.7 |
| 2007/0248829 A1 * | 10/2007 | Iwamoto et al. | 428/446 |

FOREIGN PATENT DOCUMENTS

| | | |
|---|---|---|
| EP | 1 345 264 | 9/2003 |
| EP | 1 770 773 | 4/2007 |
| EP | 1 858 078 | 11/2007 |
| GB | 2 382 082 | 5/2003 |
| JP | 3022925 | 1/2000 |
| JP | 2003 297988 | 10/2003 |
| JP | 2003 300788 | 10/2003 |
| WO | WO 2006030676 A1 * | 3/2006 |
| WO | 2006/077755 | 7/2006 |

OTHER PUBLICATIONS

Supplementary European Search Report issued Sep. 8, 2010, in European Patent Application No. 07742205.3, filed Apr. 23, 2007.

* cited by examiner

A-A' cross section

A-A' cross section

A-A' cross section

A-A' cross section

A-A' cross section

US 7,993,728 B2

ALUMINUM/SILICON CARBIDE COMPOSITE AND RADIATING PART COMPRISING THE SAME

TECHNICAL FIELD

The present invention relates to an aluminum-silicon carbide composite suitable as a base plate for power module and a heat radiation component employing the same.

BACKGROUND ART

In recent years, along with progress of high-integration and downsizing of semiconductor chips, heat generation amount of such semiconductor chip simply increases, and efficient dissipation of such heat has become a problem to be solved. For this purpose, as a circuit substrate for power module, a circuit substrate is used, which comprises a ceramic substrate such as an aluminum nitride substrate or a silicon nitride substrate having high insulation property and high thermal conductivity, and a metal circuit made of copper or aluminum formed on the ceramic substrate.

A typical heat radiation structure of conventional circuit substrate is that a base plate is soldered to a rear surface (heat radiation surface) of a circuit substrate via a metal plate such as a copper plate, and such a base plate is made of copper. However, in this structure, there has been a problem that when a heat load is applied to a semiconductor device, a crack of solder layer due to the difference of thermal expansion coefficient between the base plate and the circuit substrate occurs, and as a result, heat radiation becomes insufficient to cause malfunction or destruction of a semiconductor chip.

To cope with such a problem, an aluminum alloy-silicon carbide composite is proposed, which has a thermal expansion coefficient close to that of a circuit substrate (Patent Document 1).

Patent Document 1: JP-A-3-509860

A base plate is used as it is joined with a heat-dissipation fin in most cases, and the shape and bow of is the joined portion are also important properties. For example, when a base plate is joined with a heat-dissipation fin, usually a heat-dissipation grease having high thermal conductivity is applied to portions to be joined, and the base plate is fixed to e.g. a heat-dissipation fin or a heat-dissipation unit by screws through holes provided in the peripheral portion of the base plate. However, if many fine irregularities are present on the base plate, a gap is formed between the base plate and the heat-dissipation fin, and even if a heat-dissipation grease having high thermal conductivity is applied, thermal conductivity is significantly decreased. As a result, there has been a problem that heat radiation property of entire module constituted by the ceramic circuit substrate, the base plate and the heat-dissipation fin, etc. is significantly decreased.

To cope with this problem, in order to reduce such a gap between the base plate and the heat-dissipation fin as much as possible, a base plate formed to have a convex bow in advance is used. This bow is obtainable by applying a pressure to the base plate as it is heated, by using a jig having a predetermined shape. However, when the base plate surface is wavy, there has been a problem that the bow shape and its quality are not consistent. Further, due to the variation of bow shape or surface irregularities, there has been a problem that a large gap is still formed between the base plate and the heat-dissipation fin.

There is a method of forming a bow by machining the base plate surface. However, in this method, since the aluminum-silicon carbide composite is extremely hard, significant amount of grinding by a tool such as a diamond is required, and there has been a problem that its cost is high.

To solve the above problem, a method is proposed, in which a flat silicon carbide porous body is infiltrated with a metal containing aluminum as the main component, an aluminum alloy layer made of a metal containing aluminum as the main component is formed on each primary plane, and the aluminum alloy layer in the heat radiation side is mechanically fabricated.

However, in a case of producing a base plate by using this method, the thickness of each surface of aluminum alloy layer after the machining of the base plate is thick. For this reason, the thermal expansion coefficient of the base plate itself increases, and when it is soldered with a ceramic circuit substrate at a time of assembling a power module, there has been a case where a gap is formed on a heat radiation plane that corresponds to a rear surface of the ceramic circuit substrate.

Further, in this method, since it is necessary to control the thickness of the aluminum alloy layer on each primary plane to have uniform thickness and not to make the aluminum-silicon carbide composite exposed to the outside, there has been a problem that high degree of fabrication technique is required.

DISCLOSURE OF THE INVENTION

Problems to be Solved by the Invention

The present invention has been made considering the above circumstances, and it is an object of the present invention to provide an aluminum-silicon carbide composite suitable as a base plate for power module.

Means for Solving the Problems

The present inventors have conducted extensive studies to achieve the above object, and as a result, they have discovered that in an aluminum-silicon carbide composite that is a flat silicon carbide porous body infiltrated with a metal (hereinafter referred to as aluminum alloy) containing aluminum as the main component, forming of aluminum layers made of an aluminum alloy on both primary planes imparts plating capability to the composite and enables to control thickness difference in the entire surface of the plate-shaped silicon carbide porous body, and optimization of piling method at the time of infiltration enables to control the thicknesses of aluminum layers on both principal planes and their variations, to thereby control the bowed shape, to complete the present invention.

Namely, the present invention provides a base plate for power module, comprising an aluminum-silicon carbide composite and aluminum layers made of a metal containing aluminum as the main component formed on respective principal planes of the aluminum-silicon carbide composite, wherein the aluminum-silicon carbide composite is produced by forming or fabricating a flat plate-shaped silicon carbide porous body to have a thickness difference of at most 100 μm in the entire porous body and piling such porous bodies as they are each sandwiched between mold-releasing plates so that the fastening torque in the plane direction becomes from 1 to 20 Nm, and infiltrating a metal containing aluminum as the main component into the silicon carbide porous bodies, wherein the aluminum layers each has an average thickness of from 10 to 150 μm, the difference between the maximum thickness and the minimum thickness of the aluminum layer in each principal plane is at most 80 μm, and the difference between average thicknesses of the aluminum layers on the respective principal planes is at most 50 μm, and wherein the shape of the silicon carbide porous body is rectangle or a rectangle from which peripheral portions encompassing holes are removed.

Further, the present invention provides the base plate for power module, wherein the principal planes, the peripheries of the through holes and the peripheral portion of the base plate each comprises a metal layer containing aluminum as the main component, or a composite of ceramic fiber and a metal containing aluminum as the main component, and the present invention provides the base plate for power module, wherein the aluminum-silicon carbide composite is exposed in the peripheral portion of the base plate.

Further, the present invention provides the base plate for power module, wherein the bow of the aluminum-silicon carbide composite is from 0 to 200 μm per 10 cm length and the depth of gap is at most 50 μm, which is produced by subjecting the aluminum-silicon carbide composite to a heating treatment of at from 450 to 550° C. for at least 30 seconds under a stress of at least 10 Pa, the present invention provides the base plate for power module, wherein the aluminum-silicon carbide composite has a thermal conductivity of at least 180 W/mK and a thermal expansion coefficient of at most $9 \times 10^{-6}$/K at 150° C., and the base plate for power module, wherein the change of bow amount of the base plate is at most 30 μm per 10 cm length when the base plate is subjected to 10 cycles of heat cycle in which the base plate is maintained at 350° C. for 10 minutes and naturally cooled under a room temperature.

Further, the present invention provides the base plate for power module, wherein the aluminum-silicon carbide composite is produced by a squeeze casting method, and the present invention provides a heat radiation component comprising the base plate for power module, a Ni film of from 1 to 20 μm thick formed on the base plate for power module by a Ni-plating treatment, and a ceramic substrate for mounting a semiconductor, bonded to the base plate on which the Ni film is formed.

Effects of the Invention

The aluminum-silicon carbide composite of the present invention has characteristics that it has low thermal expansion and high thermal conductivity.

Further, by providing thin and uniform aluminum layers on both principal planes of a flat plate-shaped aluminum-silicon carbide composite, it becomes possible to impart plating capability and to significantly improve flatnesses of principal planes that function as heat radiation planes. For this reason, as compared with conventional method of bow forming the composite, heat radiation property after it is soldered with a ceramic circuit substrate is improved, and thus, it is suitable for a base plate for power module for mounting semiconductor chips requiring particularly high reliability.

Figure 1:
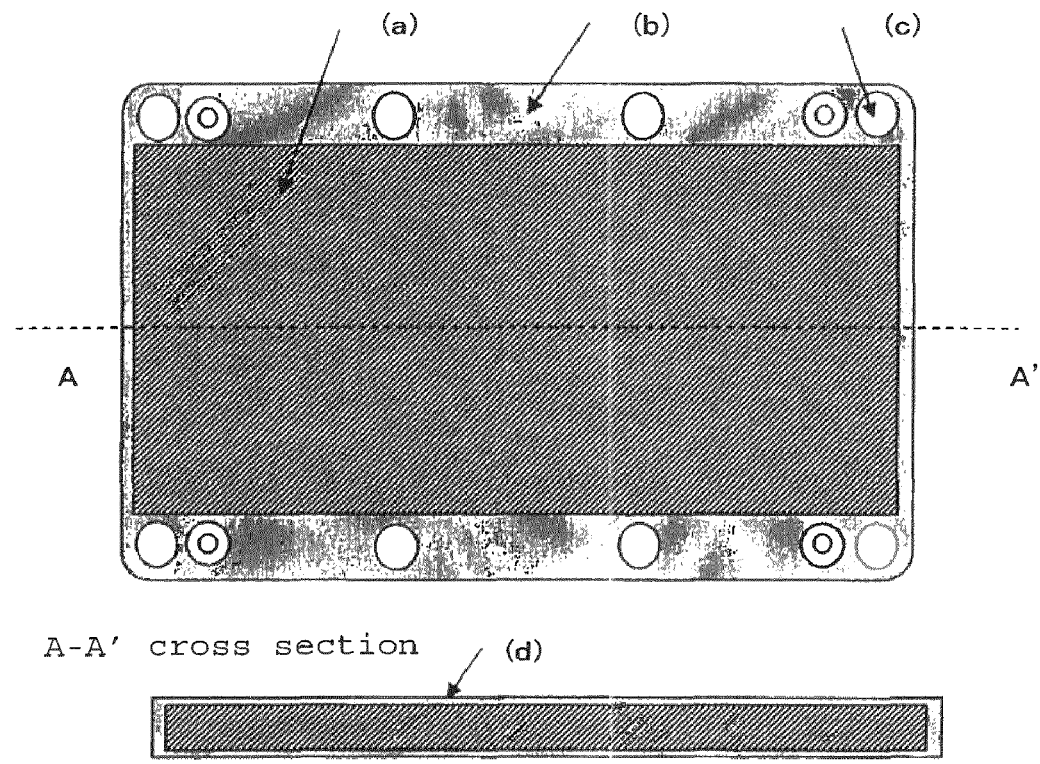
FIG. 1: A structural view of an aluminum-silicon carbide composite for base plate in an embodiment of the present invention.

EXPLANATION OF NUMERALS (a): Aluminum-silicon carbide composite
(b): Aluminum alloy
(c): Through hole of Φ7 mm
(d): Surface aluminum alloy layer
(e): Aluminum-silicon carbide composite
(f): Countersink of Φ10-4 mm
(g): Aluminum-silicon carbide composite
(h): Threaded hole of M4 mm

BEST MODE FOR CARRYING OUT THE INVENTION

The methods of producing metal-ceramic composite are is roughly categorized into two types that are infiltration methods and powder metallurgy method. Among these, metal-ceramic composites having sufficient property in e.g. thermal conduction coefficient are not obtained by powder metallurgy methods, and commercially available metal-ceramic composites are produced by infiltration methods. There are many types of infiltration methods including methods of carrying out infiltration under a normal pressure and methods of carrying out infiltration under a high pressure (squeeze casting method). Squeeze casting methods are categorized into squeeze casting methods and die cast methods.

The method suitable for the present invention is a squeeze casting method of carrying out infiltration under a high pressure, and both of squeeze casting method and die cast method can be used but squeeze casting method is preferred. A molten metal forging method among squeeze casting methods is a method of putting a ceramic porous body (hereinafter referred to as preform) in a high-pressure container, and making molten aluminum alloy be infiltrated into the preform under high temperature and high pressure environment to obtain a composite.

Now, an example of method for producing the metal-ceramic composite of the present invention by using a squeeze casting method is described. A silicon carbide powder (a binder such as a silica is added as the case requires) as a raw material is formed and sintered to produce a preform. In the present invention, in order to form an aluminum layer having a uniform predetermined thickness, it is preferred to form the preform so as to have a thickness variation of at most 100 μm, preferably at most 30 μm in the entire plane, or to fabricate a sintered product to have such thickness variation. When the thickness variation of the preform in the entire plane exceeds 100 μm, the thickness variation of surface aluminum layers of an aluminum-silicon carbide composite obtained becomes large, such being not preferred.

Preforms are piled up as they are each sandwiched between mold-releasing plates coated with mold-releasing agents, to form a block. At the time of stacking preforms to form a block, the preforms are piled up as they are each sandwiched between mold-releasing plates so that the fastening torque in the plane direction becomes from 1 to 20 Nm, preferably from 2 to 10 Nm. The method of stacking is not particularly limited, and for example, there is a method of stacking preforms as they are sandwiched between mold-releasing plates made of stainless steel coated with a mold-releasing agent, and thereafter, disposing plates made of iron on both sides, connecting these iron plates with bolts and fastening them with a predetermined fastening torque to form a block. Proper fastening torque in the plane direction changes depending on the strength of preform to be used, but when the fastening torque is less than 1 Nm, thickness of the surface aluminum layer on the aluminum-silicon carbide composite obtained may increase, or the thickness difference may become too large. On the other hand, when the fastening torque exceeds 20 Nm, the thickness of the surface aluminum layer on the aluminum-silicon carbide composite obtained may become locally too thin, and the aluminum-silicon carbide composite may be partially exposed to the outside in the subsequent surface treatment such as pretreatment for plating, and there may occur such problems that plating is not formed on such a portion or the adhesiveness of plating decreases.

Further, there is also a method of disposing formed products containing alumina or silica as the main component and containing from 5 to 40 mass % of fibers on both surfaces of each preform, and stacking such preforms as they are each sandwiched between mold-releasing plates, and thereafter, disposing iron plates on both sides, connecting these iron plates with bolts and fastening them with a predetermined fastening torque to form a block. By preliminarily disposing such formed products, there are such merits that aluminum layers of predetermined thickness can be formed and the thickness of surface aluminum layers can be controlled. When the content of fibers containing alumina or silica as the main component is less than 5 mass % in the formed product, control of the thickness of the aluminum layers on both principal planes after infiltration may become difficult. On the other hand, when the fiber content exceeds 40 mass %, the preform may be destroyed by pressure at the time of infiltration.

Then, one or two or more pieces of the above blocks that are preliminary heated at about from 500 to 750° C. are disposed in a high pressure container, molten aluminum alloy is poured into the container as quickly as possible to prevent temperature drop of the blocks, they are pressurized at a pressure of 30 MPa or more so that the aluminum alloy is infiltrated into pores in the preforms, whereby aluminum-silicon carbide composites each provided with aluminum layers on both of primary planes, are obtained. Here, for the purpose of removing residual stress formed at the time of infiltration, an annealing treatment of the infiltrated product may be carried out.

The aluminum alloy in the aluminum-silicon carbide composite of the present invention, preferably has a low melting point as much as possible to be sufficiently penetrated into pores in the preform at the time of infiltration. As such an aluminum alloy, an aluminum alloy containing from 7 to 25 mass % of silicon may, for example, be mentioned. The aluminum alloy preferably further contains magnesium since it strengthen bond between silicon carbide particles and metal portions. There is no limitation as to metal components other aluminum, silicon and magnesium in the aluminum alloy so long as its property does not extremely change, and for example, it may contain e.g. copper.

The annealing treatment for the purpose of removing residual stress at a time of infiltrating the aluminum alloy into the preform, is preferably carried out at a temperature of from 400 to 550° C., particularly preferably from 500 to 550° C., for at least 10 minutes. If the annealing temperature is less than 400° C., the residual stress in the composite is not sufficiently released, and the bow of the composite may drastically change in the heat treatment after a machining process.

On the other hand, if the annealing temperature exceeds 550° C., the infiltrated aluminum alloy may melt. If the annealing time is less than 10 minutes, even at an annealing temperature of from 400 to 550° C., the residual stress in the composite is not sufficiently released, and its bow may drastically change in the heat treatment for removing residual stress formed by a machining step.

There is no particular limitation as to the method for producing the formed product of porous silicon carbide (hereinafter referred to as SiC preform) according to the present invention, and the SiC preform can be produced by a known method. For example, it is obtainable by adding to a silicon carbide powder e.g. a silica or an alumina as a binder, mixing and forming them and sintering them at least 800° C. There is no limitation as to the forming method, and e.g. press-molding, extrusion molding or casting may be used. In the forming step, a binder for maintaining shape may be used in combination as the case requires.

Particularly important characteristics of the aluminum-silicon carbide composite is thermal conductivity and thermal expansion coefficient. As the content of silicon carbide (hereinafter referred to as SiC) in the aluminum-silicon carbide composite increases, the thermal conductivity increases and the thermal expansion coefficient decreases, and thus, the SiC content is preferably high. However, if the SiC content is too high, infiltration control of the aluminum alloy becomes difficult. Practically, the composite preferably contains at least 40 mass % of coarse SiC particles having a particle size of at least 40 µm, and the relative density of the SiC preform is preferably within a range of from 55 to 75%. Further, the SiC preform preferably has a strength of at least 3 MPa in terms of bending strength, in order to avoid breakage of the preform at a time of handling or infiltration.

Particle size of the raw material SiC particles for producing the SiC preform is preferably adjusted. This is because it is difficult for a SiC preform made only of coarse particles to exhibit high strength, and it is not possible to expect high thermal conductivity of a composite made only of fine particles. According to the study of the present inventors, for example, a mixed powder containing from 40 to 80 mass %, preferably 50 to 70 mass %, of silicon carbide coarse particles having a particle size of at least 40 µm and from 60 to 20 mass %, preferably 50 to 30 mass %, of silicon carbide fine particles having a particle size of at most 15 µm, is preferred.

The SiC preform is obtained by degreasing and sintering a formed product of silicon carbide particles. When silica sol is used as a binder and the sintering temperature is at least 800° C., a preform having a bending strength of at least 3 MPa is obtained regardless of the atmosphere at the time of sintering. In an oxidizing atmosphere, if the formed product is sintered at a temperature exceeding 1,100° C., oxidation of silicon carbide is promoted, and there is a possibility that the thermal conductivity of the aluminum-silicon carbide composite decreases. For this reason, it is preferred to sinter the formed product at a temperature of from 800 to 1,100° C., preferably from 900 to 1,050° C. in a case of oxidizing atmosphere. Baking time is appropriately determined according to the conditions such as the size of SiC preform, the amount of the formed product put in a sintering furnace or the sintering atmosphere.

When the SiC preform according to the present invention is formed into a predetermined shape, by drying one SiC preform each time or by drying SiC preforms as is they are overlaid with a spacer made of e.g. carbon interposed between them, it is possible to prevent change of the bowed shape by the drying. Further, also in the sintering step, by using a spacer usable at the sintering temperature in the same manner as the drying step, it is possible to prevent change of the shape of SiC preform due to the change of internal texture.

Figure 2:
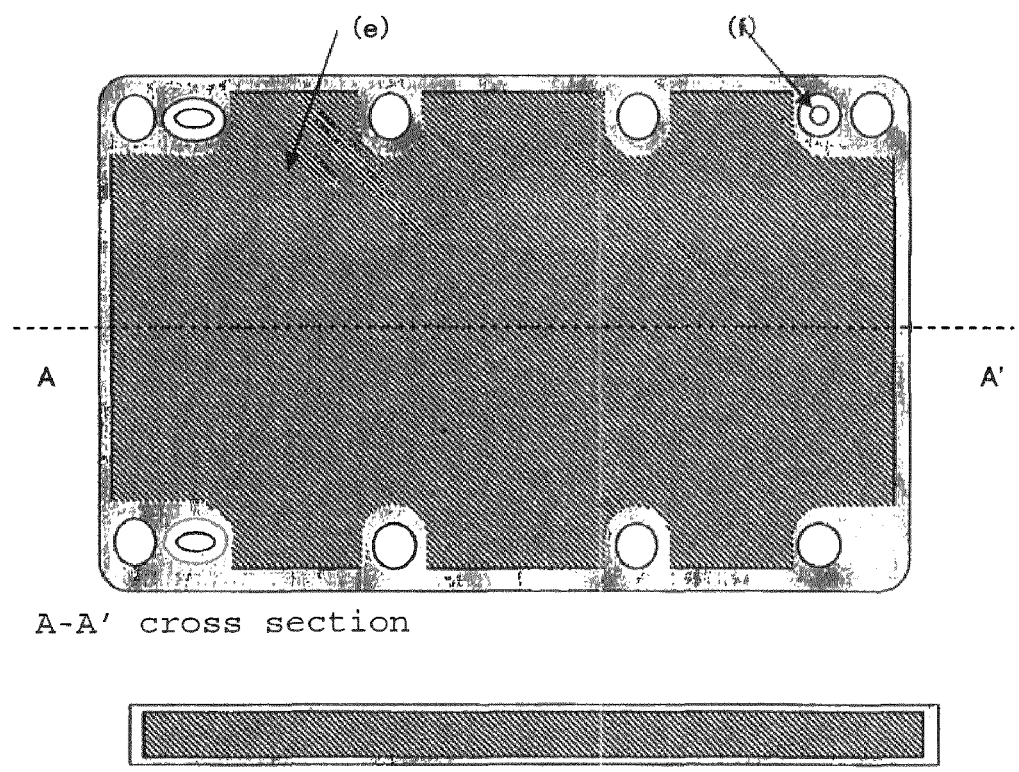
FIG. 2: A structural view of an aluminum-silicon carbide composite for base plate in an embodiment of the present invention.
Figure 3:
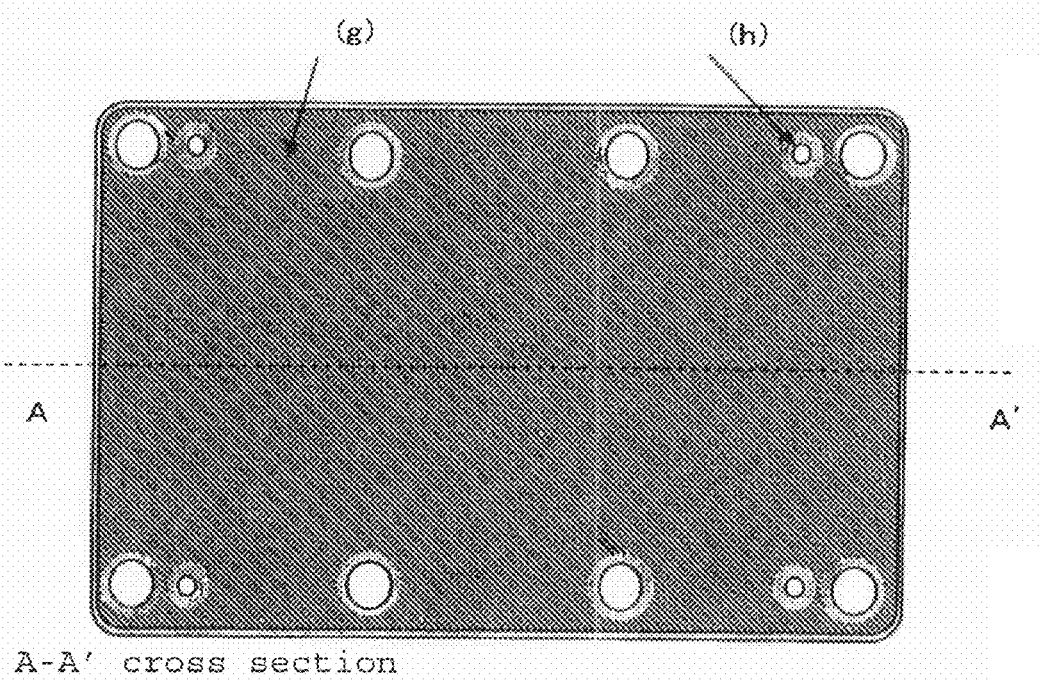
FIG. 3: A structural view of an aluminum-silicon carbide composite for base plate in an embodiment of the present invention.

The shape of SiC preform is preferably a flat-plate shape of rectangle (refer to FIG. 1(a)) or a rectangle from which portions encompassing holes in the peripheral portion are removed (refer to FIGS. 2(e) and 3(g)).

It is necessary that the peripheral portion of the aluminum-silicon carbide composite of the present invention has a predetermined shape or e.g. holes for attachment are formed on the peripheral portion in order to use the composite as a base plate for power module. In this case, since the aluminum-silicon carbide composite is extremely hard, and large amount of grinding by using a tool of e.g. a diamond is required, there is a problem that its cost becomes high. Accordingly, in order to make it easily machined, it is preferred that the portion to be machined is made of an aluminum alloy or a composite of easily machinable material comprising ceramic fiber, ceramic particles and an aluminum alloy, in advance.

The area of SiC preform in the entire region of base plate, is not particularly limited so long as it covers a portion to be joined with a ceramic circuit substrate, and it is preferably at least 70%, particularly preferably at least 85%, based on the area of base plate. By using an aluminum-silicon carbide composite for a portion to be joined with a ceramic circuit substrate, it is possible to reduce the thermal expansion difference between these members and to improve reliability of the joined portion. If the area of SiC preform is less than 70% of the area of base plate, the thermal expansion coefficient of the obtained base plate itself becomes too large, and there is a possibility that the reliability of bowed shape or reliability of joined portion decreases.

Then, an example of machining method of the aluminum-silicon carbide composite obtained will be described. The peripheral portion and holes of the aluminum-silicon carbide composite of the present invention can be easily machined by using an apparatus such as an NC lathe or a machining center.

Figure 4:
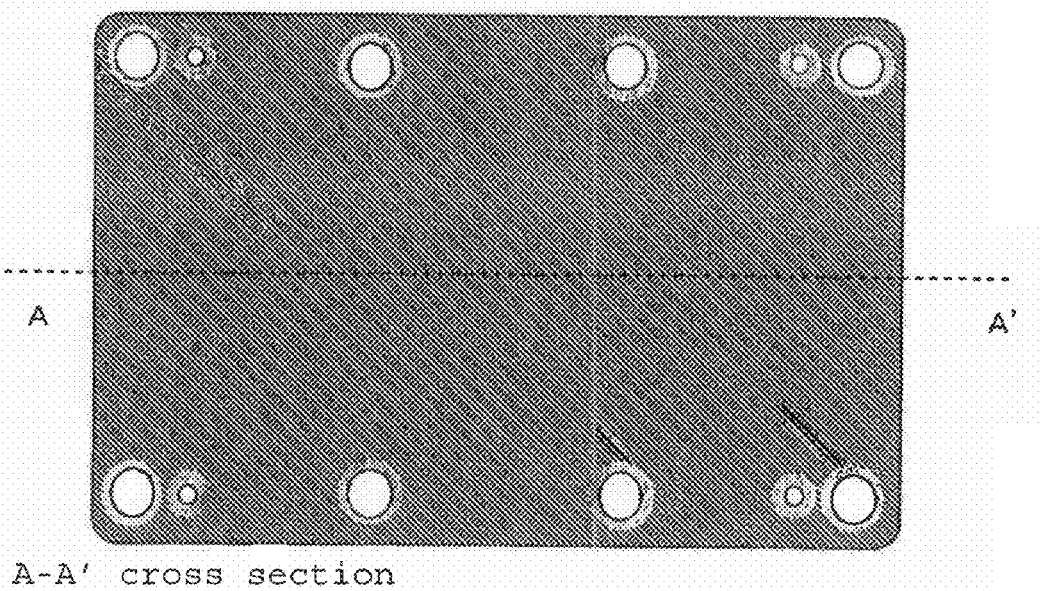
FIG. 4: A structural view of an aluminum-silicon carbide composite for base plate in an embodiment of the present invention.
Figure 5:
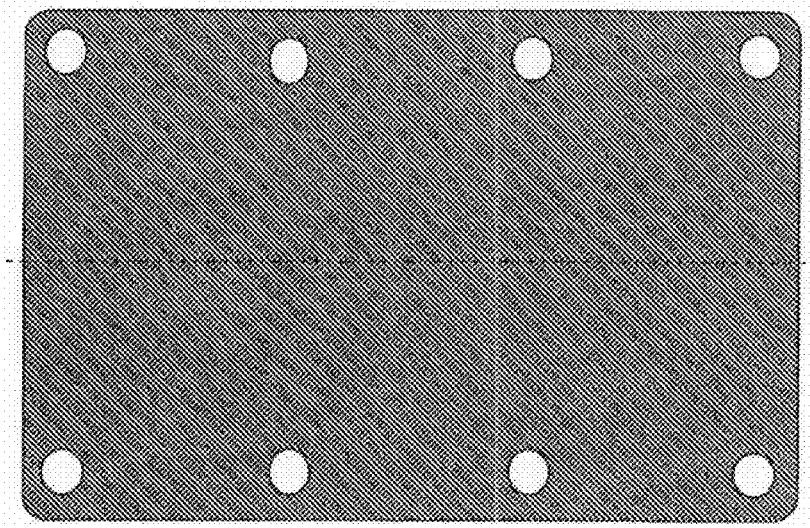
FIG. 5: A structural view of an aluminum-silicon carbide composite for base plate in an embodiment of the present invention.
Figure 5:

After the aluminum-silicon carbide composite is produced by using the above SiC preform, it is also possible to machine the peripheral portion or the peripheral portion and the holes by using e.g. a abrasive jet cutter or an electric discharge machine so that the aluminum-silicon carbide composite is exposed (refer to FIG. 4). Further, after an aluminum-silicon carbide composite is produced by using a SiC preform having an area larger than that of the base plate, it is also possible to form the peripheral portion or the holes of the base plate by the above machining method (refer to FIG. 5).

The thickness of the aluminum layers made of an aluminum alloy provided on surfaces of the aluminum-silicon carbide composite, is from 10 to 150 µm, preferably from 30 to 100 µm in terms of average thickness. The thickness of the aluminum layers can be adjusted to be a predetermined thickness by grinding the surfaces of the aluminum-silicon carbide composite.

The aluminum layers are necessary for securing plating adhesiveness at a time of providing plating treatment. If the average thickness of the aluminum layer is less than 10 µm, the aluminum-silicon carbide composite is partially exposed to the outside at a time of subsequent surface treatment such as pretreatment for plating, and there may occur such a problem that plating adhesiveness decreases. On the other hand, when the average thickness exceeds 150 µm, the thermal expansion coefficient of the base plate obtained itself becomes too large and reliability of the joined portion may decrease. Further, if the average thickness exceeds 150 µm, the difference between the thicknesses of aluminum layers may increase.

In the base plate for power module of the present invention, the difference between the maximum thickness and the minimum thickness of the surface aluminum layer is at most 80 µm, preferably at most 60 µm. When the difference between the maximum thickness and the minimum thickness of the surface aluminum layer exceeds 80 µm, waving or a gap due to the thickness difference of the surface aluminum layer occurs. If a heat radiation plane of the base plate for power module has a waving or a gap, a gap is formed between the base plate and a heat radiation fin in a subsequent module assembly step, and even if a heat radiation grease having high thermal conductivity is applied, the thermal conductivity may significantly decrease, and as a result, heat radiation property of a module constituted by a ceramic circuit substrate, the base plate and the heat radiation fin etc. may drastically decrease.

In the base plate for power module of the present invention, the difference between average thicknesses of aluminum layers on the respective principal planes is at most 50 µm, preferably at most 30 µm. The base plate for power module of the present invention has a construction comprising an aluminum-silicon carbide composite and aluminum layers formed on both principal planes of the complex. Since the thermal expansion coefficient of the aluminum-silicon carbide composite is different from that of the aluminum layers, when the difference between average thicknesses of the aluminum layers of the respective principal planes exceeds 50 µm, there occurs a problem that the bow may change when a heat cycle is applied to the base plate in the subsequent module assembly step.

The aluminum-silicon carbide composite to which a shaping fabrication is applied, is subjected to a heating treatment at a temperature of from 450 to 550° C., preferably from 500 to 550° C. for at least 30 seconds under an application of a stress of at least 10 Pa so as to have a predetermined bow shape, so that the aluminum-silicon carbide composite undergoes a creep deformation to have bow. The aluminum-silicon carbide composite after the bow forming treatment, is subjected to an annealing treatment at from 300 to 400° C. as the case requires, to remove residual stress formed at the time of bow forming. The base plate for power module of the present invention becomes to have a bow shape (FIG. 6) close to an ideal spherical shape having little waving or gap by controlling the thicknesses of surface aluminum layers to be extremely thin and uniform.

The bow amount of the base plate for power module of the present invention, is from 0 to 200 µm, preferably from 50 to 150 µm, per 10 cm length. When the composite is used as a base plate for power module, and if a heat radiation surface has a concave bow, a gap is formed between the base plate and a heat radiation fin in the subsequent module assembly step, and even if a heat radiation grease having high thermal conductivity is applied to the gap, the thermal conductivity significantly decreases. As a result, there is a case where the heat radiation property of a module constituted by the ceramic circuit substrate, the base plate and the heat-dissipation fin, etc. significantly decreases. Further, if the bow amount exceeds 200 µm, at a time of screwing the composite to the heat radiation fin to join them, there is a case where a crack is formed in the base plate or the ceramic circuit substrate.

In the present invention, by controlling the thickness of the aluminum layers provided on surfaces of the aluminum-silicon carbide composite, it is possible to make the heat radiation plane of the base plate to have a shape having little irregularities and having a gap of at most 50 µm deep. If the depth of gap in the heat radiation plane exceeds 50 µm, and when the composite is used as a base plate for power module, a gap is formed between the base plate and the heat radiation fin in the subsequent module assembly step, and even if a heat radiation grease of high thermal conductivity is applied to the gap, the thermal conductivity drastically decreases. As a result, there is a case where the heat radiation property of a module constituted by the ceramic circuit substrate, the base plate and the heat radiation fin etc. significantly decreases.

The base plate for power module of the present invention is excellent in shape stability when it is subjected to a heat cycle test (a sample is maintained at a temperature of 350° C. for 10 minutes and naturally cooled at a room temperature), that is a yardstick of reliability of power module. For example, the change amount of bow of the base plate after the heat cycle test of the above conditions is carried out 10 times, is at most 30 μm per 10 cm length. If the bow change amount exceeds 30 μm per 10 cm length, a gap is formed between the base plate and the heat radiation fin in the power module assembly step, and even if a heat radiation grease having high thermal conductivity is applied to the gap portion, the thermal conductivity may significantly decrease.

The aluminum-silicon carbide composite according to the present invention has stress easing property as well as good heat radiation property, and for example, it is suitable as a base plate to be interposed between a ceramic circuit substrate and a heat radiation component such as a heat radiation fin.

The aluminum-silicon carbide composite according to the present invention is usually employed as it is joined with a ceramic circuit substrate by soldering when the composite is used as a base plate for power module. For this reason, a Ni plating needs to be applied to the surface of base plate. The plating treatment method is not particularly limited, and it may be any one of electroless plating treatment or an electroplating treatment. The thickness of Ni plating is from 1 to 20 μm, preferably from 3 to 12 μm. If the plating thickness is less than 1 μm, pinholes may be formed in a part of the plated film, or a soldering void (pore) may be formed at a time of soldering, which may deteriorate heat radiation property from a circuit substrate. On the other hand, if the thickness of Ni plating exceeds 20 μm, the plated film may be peeled off by the heat expansion difference between the Ni plating film and the surface aluminum layer. In terms of the purity of Ni plating film, there is no limitation so long as it does not deteriorate wet property for solder, and the film may contain e.g. phosphorus or boron.

The aluminum-silicon carbide composite of the present invention preferably has a thermal conductivity of at least 180 W/mK and a thermal expansion coefficient of at most $9 \times 10^{-6}$/K at 150° C. Besides the above effects, the composite has high thermal conductivity and a low thermal expansion coefficient equivalent to that of a semiconductor chip or a ceramic circuit substrate, whereby a heat radiation component employing such a composite or a power module employing such a heat radiation component is excellent in heat radiation property and there is also a merit that it is hardly deformed even if its temperature is changed, and as a result, high reliability is obtained.

EXAMPLES

Now, the present invention is described in more is detail with reference to Examples and Comparative Examples, but the present invention is by no means constructed as limited to these Examples.

Example 1 and Comparative Example 1

100 g of silicon carbide particles A (manufactured by Pacific Rundum Co., Ltd.: NG-150, average particle size: 100 μm), 100 g of silicon carbide particles B (manufactured by Pacific Rundum Co., Ltd.: NG-220, average particle size: 60 μm), 100 g of silicon carbide particles C (manufactured by Yakushima Denko Co., Ltd.: GC-1000F, average particle size: 10 μm) and 30 g of silica sol (manufactured by Nissan Chemical Industries, Ltd.: Snowtex) were weighed, and they were blended for 30 minutes by a stirring mixer, and press-molded at a pressure of 10 MPa into a flat plate shape of 190 mm×140 mm×5.8 mm size.

The formed product obtained was dried at a temperature of 120° C. for 2 hours, and sintered in an atmospheric air at a temperature of 950° C. for 2 hours to obtain a SiC preform having a relative density of 65%. Surfaces of the SiC preform obtained were machined to have a thickness of 5 mm by a surface grinder employing a grinding stone made of diamond, and its outer peripheral portion is machined to have an outer dimension of 183×133 mm shown in FIG. 2 by a machining center. With respect to the SiC preform obtained, the three point bending strength was measured, and as a result, it was 5 MPa.

In Comparative Example 1, a SiC preform was produced in the same manner as Example 1 except that the dimension of molded product was made to 190 mm×140 mm×5.0 mm, and without carrying out plane machining, only its outer peripheries are machined.

Table 1 shows the measurement results of the thicknesses of the SiC preforms obtained in Example 1 and Comparative Example 1 after machined. Here, the thicknesses are measured at center points of nine evenly divided sections of each preform.

TABLE 1

| Item | Measurement point | Ex. 1 | Comp. Ex. 1 |
| --- | --- | --- | --- |
| Preform thickness (mm) | 1 | 5.00 | 5.03 |
|  | 2 | 5.00 | 5.12 |
|  | 3 | 4.99 | 5.08 |
|  | 4 | 4.98 | 5.01 |
|  | 5 | 5.01 | 5.02 |
|  | 6 | 4.99 | 4.95 |
|  | 7 | 4.98 | 5.00 |
|  | 8 | 5.00 | 4.94 |
|  | 9 | 4.98 | 4.99 |
| Average (mm) |  | 4.99 | 5.02 |
| Maximum (mm) |  | 5.01 | 5.12 |
| Minimum (mm) |  | 4.98 | 4.94 |
| Thickness difference (mm) *1 |  | 0.03 | 0.18 |

*1: Thickness difference = the difference between maximum and minimum

20 SiC preforms obtained in each of Example 1 and Comparative Example 1 were piled up as they were each sandwiched between stainless steel plate each having a size of 210×160×0.8 mm whose both planes are coated with carbon, and thereafter, two iron plates of 12 mm thick were disposed on both sides of the pile and connected with six M10 bolts, and the bolts were fastened by a torque wrench so that the fastening torque in the plane direction became 3 Nm, to constitute a block. Subsequently, the integrated block was preliminary heated at 600° C. in an electric furnace, the block was accommodated in a preliminary heated press mold having an inner diameter of 300 mm, a molten aluminum alloy containing 12 mass % of silicon and 0.8 mass % of magnesium, was poured and they were pressurized under a pressure of 100 MPa for 20 minutes so that the aluminum alloy was infiltrated into the silicon carbide porous body. They were cooled to a room temperature, and they were cut along the shape of mold-releasing plate by using a wet type band saw, the sandwiching stainless plates were removed, and an annealing treatment was carried out at a temperature of 530° C. for 3 hours to remove residual stress caused by the infiltration, to obtain an aluminum-silicon carbide composite.

In the peripheral portion of the aluminum-silicon carbide composite obtained, 8 through holes of 7 mm in diameter and 4 countersinks of from Φ10-4 mm were formed, and the peripheral aluminum layer portions were machined is by an NC lathe, so that the composite had a shape of 187×137×5 mm.

Then, in order to impart bow to the aluminum-silicon carbide composite, a concave-convex mold made of carbon and having a spherical surface of a curvature radius R=15,000 mm was prepared. This concave-convex mold was attached to a thermal press machine, and the mold was heated to have a surface temperature of 510° C. Between the concave-convex molds, the complex was disposed and it was pressed at 40 KPa. At this time, a thermocouple was contacted to the side face of the complex to measure the temperature. The compression was maintained for 3 minutes after the temperature of the complex became 500° C., and thereafter, the compression was released and it was naturally cooled to 50° C. Then, the machined product obtained was subjected to an annealing treatment in an electric furnace at a temperature of 350° C. for 1 hour to remove residual stress caused at a time of producing a bowed shape. Subsequently, it was subjected to a blast treatment under a pressure of 0.4 MPa and a feeding speed of 1.0 m/min with alumina abrasive particles, to be cleaned. Subsequently, it was subjected to electroless Ni—P and Ni—B platings to form a plating layer of 8 μm thick (Ni—P: 6 μm+Ni—B: 2 μm) on the surface of the composite.

Each sample of the aluminum-silicon carbide composite obtained was cut along its diagonal line and the thickness of aluminum layer on one principal plane exposed by the cutting was measured at 20 points at constant intervals along the diagonal line, and its average thickness was calculated.

Figure 6:
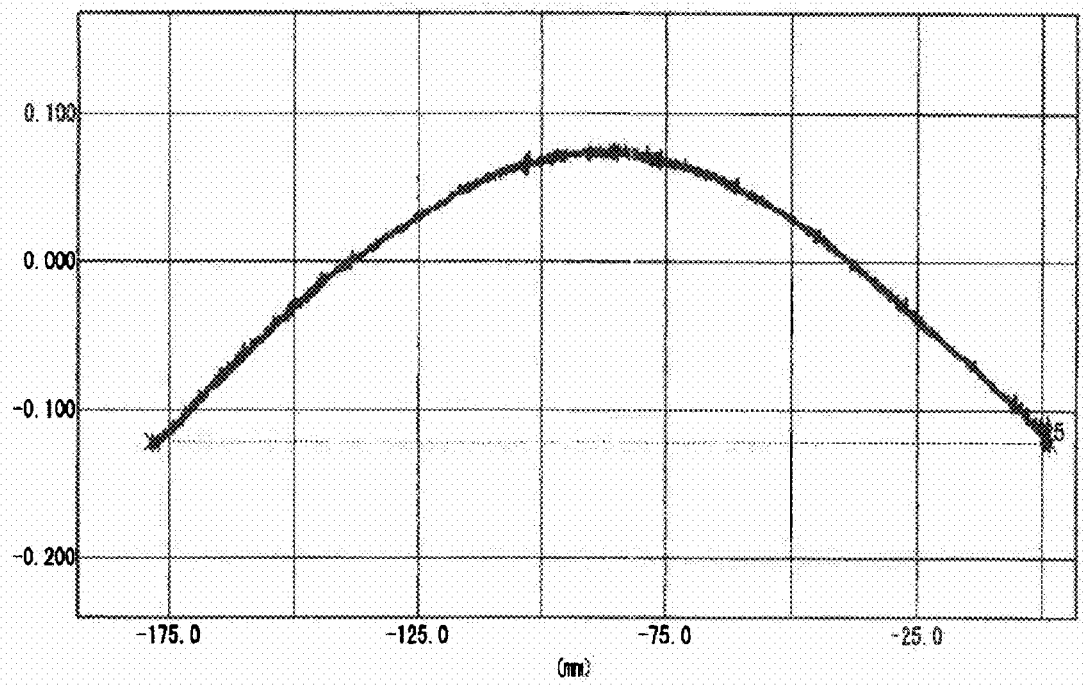
FIG. 6: Measurement result of bowed shape by a profile measurement tool of Example 1.

Further, a test piece for thermal expansion coefficient measurement (3 mm in diameter, 10 mm long) and a test piece for thermal conductivity measurement (11 mm in diameter, 3 mm thick) were produced by grinding. By using these test pieces, the thermal expansion coefficient at 150° C. was measured by using a thermal expansion meter (manufactured by Seiko Instruments Inc., TMA300) and the thermal conductivity at 25° C. was measured by a laser flash method (manufactured by Rigaku Corporation: LF/TCM-8510B). With respect to the bowed shape, using a contour measurement instrument (manufactured by TOKYO SEIMITSU CO., LTD.: Contour Cord 1600D-22), the bowed amount per 10 cm length and gap depth of each sample were measured. Table 2 shows the results. Further, FIG. 6 shows the bowed shape measurement results of Example 1 by the contour measurement instrument.

By using the plated product of Example 1, 10 cycles of heat cycle test was carried out, wherein the plated product was put on a hot plate heated at 350° C., it was left for 10 minutes after its temperature reached 350° C., and naturally cooled to a room temperature in each cycle. The change of bow amount per 10 cm length by the heat cycle test of Example 1 was 15 μm.

Example 2

A SiC preform having a relative density of 66% was obtained in the same manner as Example 1 except that 150 g of silicon carbide particles A (manufactured by Pacific Rundum Co., Ltd.: NG-150, average particle size: 100 μm), 50 g of silicon carbide particles D (manufactured by Pacific Rundum Co., Ltd.: NG-500, average particle size: 30 μm), 100 g of silicon carbide particles C (manufactured by Yakushima Denko Co., Ltd.: GC-1000F, average particle size: 10 μm) and 30 g of silica sol (manufactured by Nissan Chemical Industries, Ltd.: Snowtex) were used as raw materials. A surface of the SiC preform obtained was ground by a surface grinding machine by using a grinding stone made of diamond so that the sample had a thickness of 4.9 mm, and the peripheral portion was machined to have an outer dimension of 183×133 mm and have the shape shown in FIG. 2. Table 3 shows the measurement results of the thickness of SiC preform after machining.

TABLE 3

| Item | Measurement point | Ex. 2 |
|---|---|---|
| Preform thickness (mm) | 1 | 4.92 |
| | 2 | 4.91 |
| | 3 | 4.89 |
| | 4 | 4.92 |
| | 5 | 4.88 |
| | 6 | 4.92 |
| | 7 | 4.90 |
| | 8 | 4.91 |
| | 9 | 4.91 |
| Average (mm) | | 4.91 |
| Maximum (mm) | | 4.92 |
| Minimum (mm) | | 4.88 |
| Thickness difference (mm) *1 | | 0.04 |

*1: Thickness difference = the difference between maximum and minimum

TABLE 2

| | | Thermal | Al layer thickness (μm) | | | | | |
| | | | A surface (concave surface) | | B surface (convex surface) | | Warpage | Recess |
| | Thermal conductivity | expansion coefficient | | | | | amount | depth |
| Item | (W/mK) | (ppm/K) | Average | Range *2 | Average | Range *2 | (μm) *3 | (μm) |
| Ex. 1 | 210 | 7.3 | 60 | 30 | 60 | 30 | 80 | 15 |
| Comp. Ex. 1 | 205 | 7.8 | 170 | 110 | 130 | 100 | 90 | 60 |

*2: Range = the difference between the maximum and the minimum
*3: Warpage amount per 10 cm length at the center in the long side direction of bowed surface (B surface)

On each surface of the SiC preform obtained, a 5 mass % alumina fiber (manufactured by Tanaka Seishi Co., purity: 97%) of 180×130×0.2 mm was provided, they were sandwiched by stainless steel plates of 210×160×0.8 mm both surfaces of which were coated with carbon, 20 of such sandwiched preforms were piled up and iron plates of 12 mm thick were provided on both surfaces of the pile, they were connected with six M10 bolts and the bolts were fastened by a torque wrench so that the fastening torque in the plane direction became 5 Nm, to form a single block. Subsequently, the integrated block was subjected to an infiltration treatment in the same manner as Example 1 and an annealing treatment at 530° C. for 3 hours to remove residual stress formed at the time of infiltration, to obtain an aluminum-silicon carbide composite.

In the aluminum-silicon carbide composite obtained, 8 through holes of 7 mm in diameter and 4 counter countersinks of Φ10-4 mm were formed in the peripheral portion by machining, and the outer periphery of the complex was machined into 187×137 mm (R7 in corners) (refer to FIG. 2). Subsequently, the composite was subjected to a blast treatment under a pressure of 0.4 MPa and a feeding speed of 1.0 m/min with alumina abrasive particles, to be cleaned, and thereafter, subjected to electroless Ni—P and Ni—B platings, to form a plating layer of 8 μm thick (Ni—P: 6 μm+Ni—B: 2 μm) on surfaces of the composite. With respect to the composite obtained, an evaluation was carried out in the same manner as Example 1. Table 4 shows the results.

TABLE 5

| Item | Measurement point | Ex. 3 |
| --- | --- | --- |
| Preform thickness (mm) | 1 | 5.01 |
| | 2 | 5.01 |
| | 3 | 4.99 |
| | 4 | 5.02 |
| | 5 | 5.00 |
| | 6 | 5.01 |
| | 7 | 4.98 |
| | 8 | 5.01 |
| | 9 | 5.01 |
| Average (mm) | | 5.00 |
| Maximum (mm) | | 5.02 |
| Minimum (mm) | | 4.98 |
| Thickness difference (mm) *1 | | 0.04 |

*1: Thickness difference = the difference between maximum and minimum

TABLE 4

| Item | Thermal conductivity (W/mK) | Thermal expansion coefficient (ppm/K) | Al layer thickness (μm) | | | | Warpage amount (μm) *3 | Recess depth (μm) |
| --- | --- | --- | --- | --- | --- | --- | --- | --- |
| | | | A surface (concave surface) | | B surface (convex surface) | | | |
| | | | Average | Range *2 | Average | Range *2 | | |
| Ex. 2 | 215 | 7.5 | 90 | 40 | 90 | 30 | 100 | 20 |

*2: Range = the difference between the maximum and the minimum
*3: Warpage amount per 10 cm length at the center in the long side direction of bowed surface (B surface)

Example 3

A SiC preform was produced in the same manner as Example 2 except that the SiC preform was sintered in an atmospheric air at 1,100° C. for 2 hours. The three point bending strength of the preform obtained was 12 MPa. Table 5 shows the measurement results of the thicknesses of the SiC preform after machined. Then, the fastening torque was changed to 10 Nm, and an aluminum-silicon carbide composite was produced in the same manner as Example 1, it was subjected to a plating treatment in the same manner as Example 1 and evaluation was made in the same manner as Example 1. Table 6 shows the results.

TABLE 6

| Item | Thermal conductivity (W/mK) | Thermal expansion coefficient (ppm/K) | Al layer thickness (μm) | | | | Warpage amount (μm) *3 | Recess depth (μm) |
| --- | --- | --- | --- | --- | --- | --- | --- | --- |
| | | | A surface (concave surface) | | B surface (convex surface) | | | |
| | | | Average | Range *2 | Average | Range *2 | | |
| Ex. 3 | 200 | 7.0 | 45 | 25 | 45 | 25 | 75 | 10 |

*2: Range = the difference between the maximum and the minimum
*3: Warpage amount per 10 cm length at the center in the long side direction of bowed surface (B surface)

Example 4

An aluminum-silicon carbide composite was prepared in the same manner as Example 1 except that the shape of the SiC preform was 190×140×5.3 mm. In the composite obtained, 8 through holes of 8 mm in diameter were formed in the peripheral portion of the composite, and its circumference was machined by a abrasive jet cutter so that the dimension of the composite became 187×137 mm (corner portions were each R7 mm) (refer to FIG. 5). Then, in order to warp the aluminum-silicon carbide composite, a concave-convex mold having a spherical surface of a curvature radius R=12,000 mm made of carbon was used to warp the composite in the same manner as Example 1. Subsequently, the composite was subjected to a blast treatment under a pressure of 0.4 MPa and a feeding speed of 1.0 m/min with alumina abrasive particles, so as to be cleaned. Thereafter, the composite was subjected to electroless Ni—P and Ni—B platings, and as a result, a plating layer of 8 μm thick (Ni—P: 6 μm+Ni—B: 2 μm) was formed on the surface of the composite. With respect to the composite obtained, evaluation was made in the same manner as Example 1. Table 7 shows the results.

TABLE 7

| Item | Thermal conductivity (W/mK) | Thermal expansion coefficient (ppm/K) | Al layer thickness (μm) | | | | Warpage amount (μm) *3 | Recess depth (μm) |
| --- | --- | --- | --- | --- | --- | --- | --- | --- |
| | | | A surface (concave surface) | | B surface (convex surface) | | | |
| | | | Average | Range *2 | Average | Range *2 | | |
| Ex. 4 | 210 | 7.4 | 60 | 30 | 60 | 30 | 80 | 15 |

*2: Range = the difference between the maximum and the minimum
*3: Warpage amount per 10 cm length at the center in the long side direction of bowed surface (B surface)

Example 5

The SiC preform of Example 1 was machined to 185×135×5.0 mm, and 12 through holes of 10 mm in diameter was formed in the peripheral portion by using a grinding stone made of diamond (refer to FIG. 4). Subsequently, in the same manner as Example 1, a composite of 187×137×5.0 mm was produced, it was subjected to a plating treatment, and evaluation was made in the same manner as Example 1. Table 8 shows the results.

TABLE 8

| Item | Thermal conductivity (W/mK) | Thermal expansion coefficient (ppm/K) | Al layer thickness (μm) | | | | Warpage amount (μm) *3 | Recess depth (μm) |
| --- | --- | --- | --- | --- | --- | --- | --- | --- |
| | | | A surface (concave surface) | | B surface (convex surface) | | | |
| | | | Average | Range *2 | Average | Range *2 | | |
| Ex. 5 | 215 | 7.3 | 65 | 30 | 65 | 30 | 90 | 20 |

*2: Range = the difference between the maximum and the minimum
*3: Warpage amount per 10 cm length at the center in the long side direction of bowed surface (B surface)

Example 6

An aluminum-silicon carbide composite was produced in the same manner as Example 1 except that the shape of preform was changed to 180×110×5.3 mm (refer to FIG. 1), and it was subjected to machining and a plating treatment. A composite obtained was evaluated in the same manner as Example 1, and Table 9 shows the results.

TABLE 9

| Item | Thermal conductivity (W/mK) | Thermal expansion coefficient (ppm/K) | Al layer thickness (μm) | | | | Warpage amount (μm) *3 | Recess depth (μm) |
| --- | --- | --- | --- | --- | --- | --- | --- | --- |
| | | | A surface (concave surface) | | B surface (convex surface) | | | |
| | | | Average | Range *2 | Average | Range *2 | | |
| Ex. 6 | 205 | 7.5 | 60 | 50 | 60 | 40 | 100 | 20 |

*2: Range = the difference between the maximum and the minimum
*3: Warpage amount per 10 cm length at the center in the long side direction of bowed surface (B surface)

INDUSTRIAL APPLICABILITY

The aluminum-silicon carbide composite of the present invention shows low thermal expansion equivalent to those of semiconductor chips or ceramic circuit substrates, and a power module employing such a composite is excellent in heat radiation property, it hardly deforms even if the temperature changes, and thus, it is usable as a base plate for power module for mounting semiconductor chips required to have high reliability.

The entire disclosure of Japanese Patent Application No. 2006-122350 filed on Apr. 26, 2006 including specification, claims, drawings and summary is incorporated herein by reference in its entirety.

The invention claimed is:

1. A base plate for a power module, comprising an aluminum-silicon carbide composite and aluminum layers made of a metal containing aluminum as the main component formed on respective principal planes of the aluminum-silicon carbide composite, wherein the aluminum-silicon carbide composite is produced by forming or fabricating a flat plate-shaped silicon carbide porous body to have a thickness difference of at most 100 μm in the entire porous body and piling such porous bodies as they are each sandwiched between mold-releasing plates so that the fastening torque in the plane direction becomes from 1 to 20 Nm, and infiltrating a metal containing aluminum as the main component into the silicon carbide porous bodies,
    wherein the aluminum layers each has an average thickness of from 10 to 150 μm, the difference between the maximum thickness and the minimum thickness of the aluminum layer in each principal plane is at most 80 μm, and the difference between average thicknesses of the aluminum layers on the respective principal planes is at most 50 μm, and wherein the shape of the silicon carbide porous body is rectangular or a rectangle from which peripheral portions encompassing holes are removed,
    wherein a depth of gap of the aluminum-silicon carbide composite is at most 50 μm.

2. The base plate for a power module according to claim 1, wherein the principal planes, the peripheries of the through holes and the peripheral portion of the base plate each comprises a metal layer containing aluminum as the main component, or a composite of ceramic fiber and a metal containing aluminum as the main component.

3. The base plate for a power module according to claim 1, wherein the aluminum-silicon carbide composite is exposed in the peripheral portion of the base plate.

4. The base plate for a power module according to claim 1, wherein the bow of the aluminum-silicon carbide composite is from 0 to 200 μm per 10 cm length and the depth of gap is at most 50 μm, which is produced by subjecting the aluminum-silicon carbide composite to a heating treatment of from 450 to 550° C. for at least 30 seconds under a stress of at least 10 Pa.

5. The base plate for a power module according to claim 1, wherein the aluminum-silicon carbide composite has a thermal conductivity of at least 180 W/mK and a thermal expansion coefficient of at most $9\times10^{-6}$/K at 150° C.

6. The base plate for a power module according to claim 1, wherein the change of bow amount of the base plate is at most 30 μm per 10 cm length when the base plate is subjected to 10 cycles of heat cycle in which the base plate is maintained at 350° C. for 10 minutes and naturally cooled at room temperature.

7. The base plate for a power module according to claim 1, wherein the aluminum-silicon carbide composite is produced by a squeeze casting method.

8. A heat radiation component comprising the base plate for a power module as defined in claim 1, a Ni film of from 1 to 20 μm thick formed on the base plate for a power module by a Ni-plating treatment, and a ceramic substrate for mounting a semiconductor, bonded to the base plate on which the Ni film is formed.

9. The base plate for a power module according to claim 1, wherein the flat plate-shaped silicon carbide porous body has a thickness difference of at most 30 μm in the entire porous body.

10. The base plate for a power module according to claim 1, wherein the aluminum layers each has an average thickness of from 30 to 100 μm.

11. The base plate for a power module according to claim 2, wherein the principal planes, the peripheries of the through holes and the peripheral portion of the base plate each comprises a metal layer containing aluminum as the main component.

12. The base plate for a power module according to claim 2, wherein the principal planes, the peripheries of the through holes and the peripheral portion of the base plate each comprises a composite of ceramic fiber and a metal containing aluminum as the main component.

13. A method of making the base plate for a power module of claim 1, comprising
    infiltrating a metal comprising aluminum as the main component into said silicon carbide porous body.

* * * * *